(12) United States Patent
Renault et al.

(10) Patent No.: US 9,711,290 B2
(45) Date of Patent: Jul. 18, 2017

(54) CURVED RF ELECTRODE FOR IMPROVED CMAX

(71) Applicant: CAVENDISH KINETICS, INC., San Jose, CA (US)

(72) Inventors: Mickael Renault, San Jose, CA (US); Vikram Joshi, Mountain View, CA (US); Robertus Petrus Van Kampen, S-Hertogenbosch (NL); Thomas L. Maguire, Santa Clara, CA (US); Richard L. Knipe, McKinney, TX (US)

(73) Assignee: Cavendish Kinetics, Inc., San Jose, CA (US)

( * ) Notice: Subject to any disclaimer, the term of this patent is extended or adjusted under 35 U.S.C. 154(b) by 0 days.

(21) Appl. No.: 15/024,931

(22) PCT Filed: Sep. 24, 2014

(86) PCT No.: PCT/US2014/057220
§ 371 (c)(1),
(2) Date: Mar. 25, 2016

(87) PCT Pub. No.: WO2015/050761
PCT Pub. Date: Apr. 9, 2015

(65) Prior Publication Data
US 2016/0240320 A1    Aug. 18, 2016

Related U.S. Application Data

(60) Provisional application No. 61/885,678, filed on Oct. 2, 2013.

(51) Int. Cl.
*H01L 29/84* (2006.01)
*H01G 5/16* (2006.01)
(Continued)

(52) U.S. Cl.
CPC .............. *H01G 5/16* (2013.01); *B81B 3/0086* (2013.01); *B81C 1/00166* (2013.01);
(Continued)

(58) Field of Classification Search
CPC .............. B81B 3/0086; B81C 1/00166; B81C 1/00222; B81C 1/0023; B81C 1/00238;
(Continued)

(56) References Cited

U.S. PATENT DOCUMENTS 6,625,004 B1    9/2003  Musolf et al.
2003/0146079 A1*  8/2003  Goldsmith .............. H01P 1/127
200/181

(Continued)

FOREIGN PATENT DOCUMENTS

CN    1975946 A    6/2007
CN    101034623 A    9/2007
(Continued)

OTHER PUBLICATIONS

Office Action and Search Report in related application CN 2014800543063 dated Mar. 23, 2017.

*Primary Examiner* — Matthew Landau
*Assistant Examiner* — Scott Stowe
(74) *Attorney, Agent, or Firm* — Patterson & Sheridan, LLP

(57) ABSTRACT

The present invention generally relates to a MEMS device and a method of manufacture thereof. The RF electrode, and hence, the dielectric layer thereover, has a curved upper surface that substantially matches the contact area of the bottom surface of the movable plate. As such, the movable plate is able to have good contact with the dielectric layer and thus, good capacitance is achieved.

12 Claims, 5 Drawing Sheets

(51) Int. Cl.
*H01H 59/00* (2006.01)
*B81B 3/00* (2006.01)
*B81C 1/00* (2006.01)
*H01G 5/011* (2006.01)

(52) U.S. Cl.
CPC ......... *H01G 5/011* (2013.01); *H01H 59/0009* (2013.01); *B81B 2201/0221* (2013.01); *B81B 2203/04* (2013.01); *B81C 2201/0104* (2013.01); *B81C 2201/0109* (2013.01)

(58) Field of Classification Search
CPC ............ B81C 1/00246; B81C 1/00253; B81C 1/0026; B81C 1/00134; B81C 1/0015; B81C 1/00158
See application file for complete search history.

(56) References Cited

U.S. PATENT DOCUMENTS

| | | | |
|---|---|---|---|
| 2007/0206340 A1 | 9/2007 | Shimanouchi et al. | |
| 2008/0180876 A1* | 7/2008 | Shimanouchi | H01G 5/01 361/292 |
| 2011/0133597 A1* | 6/2011 | Pavlov | B81C 1/00484 310/300 |
| 2014/0211366 A1* | 7/2014 | Morris, III | H01G 5/16 361/277 |

FOREIGN PATENT DOCUMENTS

| | | |
|---|---|---|
| CN | 101438366 A | 5/2009 |
| DE | 19854450 A1 | 6/2000 |
| EP | 1760736 A1 | 3/2007 |
| WO | 2013/033725 A1 | 3/2013 |

* cited by examiner

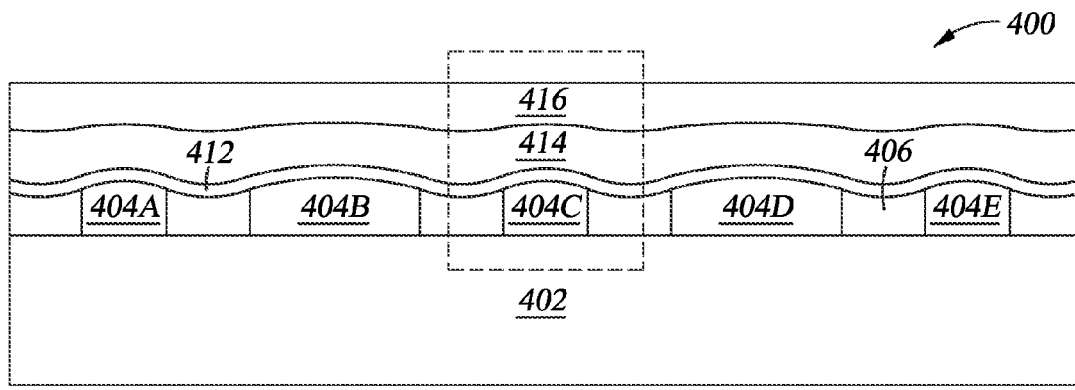
Fig. 4D
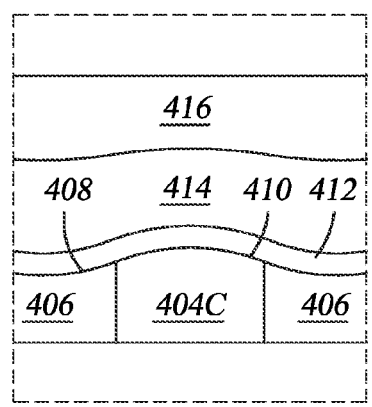 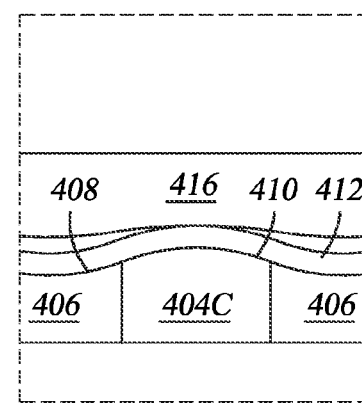
Fig. 4E                Fig. 4F

CURVED RF ELECTRODE FOR IMPROVED CMAX

BACKGROUND OF THE INVENTION

Field of the Invention

Embodiments of the present invention generally relate to a micro electromechanical system (MEMS) device and a method for manufacture thereof.

Description of the Related Art

MEMS devices typically include a movable plate (i.e., switching element) that is movable between multiple positions, such as between a position in close contact with an electrode and a position spaced from the electrode. Some MEMS devices are used in digital variable capacitors (DVC).

Some DVC devices are based on a moveable MEMS element with a control-electrode above (i.e., a pull-up or pull-off or PU-electrode) and below (i.e., a pull-in or pull-down or PD-electrode) the moveable MEMS element, as shown schematically in FIG. 1. In addition there is an RF-electrode below the moveable MEMS element (i.e., plate or cantilever or movable plate electrode). During operation a voltage is applied to either the PU or PD-electrode, which causes the MEMS element to be pulled-up or pulled-down in contact to provide a stable minimum or maximum capacitance to the RF-electrode. In this way the capacitance from the moveable element to the RF-electrode (which resides below the moveable element) can be varied from a high capacitance $C_{max}$ when pulled to the bottom (See FIG. 2) to a low capacitance $C_{min}$ (See FIG. 3) when pulled to the top.

Thus, the distance between the movable plate and the RF electrode affects the capacitance. If the movable plate does not properly contact the dielectric disposed over the RF electrode, the capacitance of each MEMS device may be unique and thus, device to device repeatability may be difficult. In order to have repeatable, consistent capacitances, the movable plate should have a consistent, good contact with the dielectric layer.

Therefore, there is a need in the art for devices and methods for forming devices wherein the movable plate has good contact with the dielectric layer in a MEMS device.

SUMMARY OF THE INVENTION

The present invention generally relates to a MEMS device and a method of manufacture thereof. The RF electrode, and hence, the dielectric layer thereover, has a curved upper surface that substantially matches the contact area of the bottom surface of the movable plate. As such, the movable plate is able to have good contact with the dielectric layer and thus, good capacitance is achieved.

In one embodiment, a MEMS DVC comprises an RF electrode having a substantially convex top surface; and a plate electrode having a substantially concave portion disposed over the convex top surface of the RF electrode.

In another embodiment, a method of manufacturing a MEMS DVC comprises forming one or more electrodes over a substrate; depositing an dielectric layer over the electrodes and the substrate; chemical mechanically polishing the dielectric layer to expose the one or more electrodes, wherein the chemical mechanical polishing results in a convex upper surface of the one or more electrodes; and forming a plate electrode over the one or more electrodes, wherein the plate electrode has a bottom surface having a concave portion overlying the convex upper surface of the one or more electrodes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4F are schematic cross-sectional illustrations of a MEMS DVC at various stages of manufacturing.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
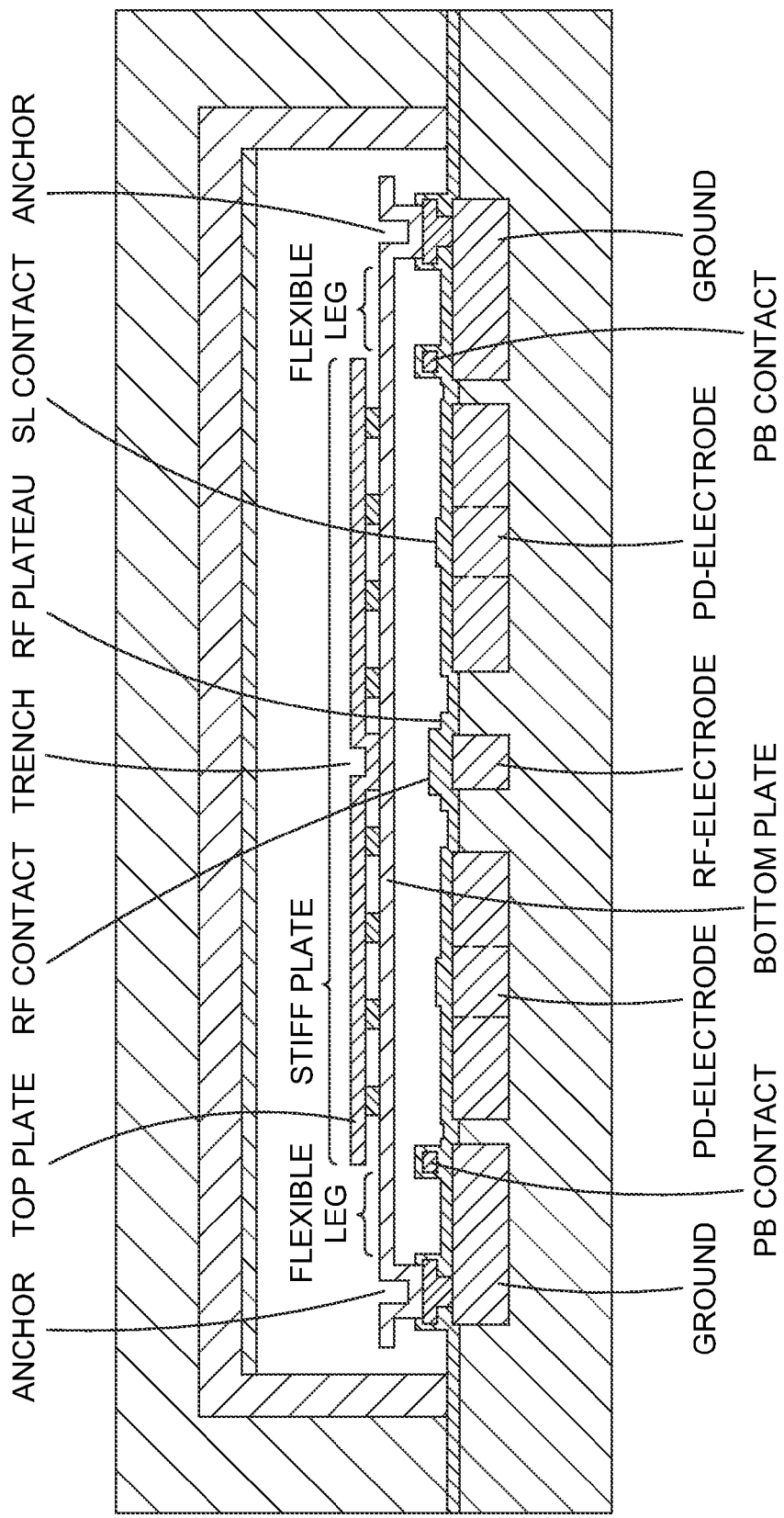
FIG. 1 is a schematic cross-sectional illustration of a MEMS DVC in the free standing state.
Figure 2:
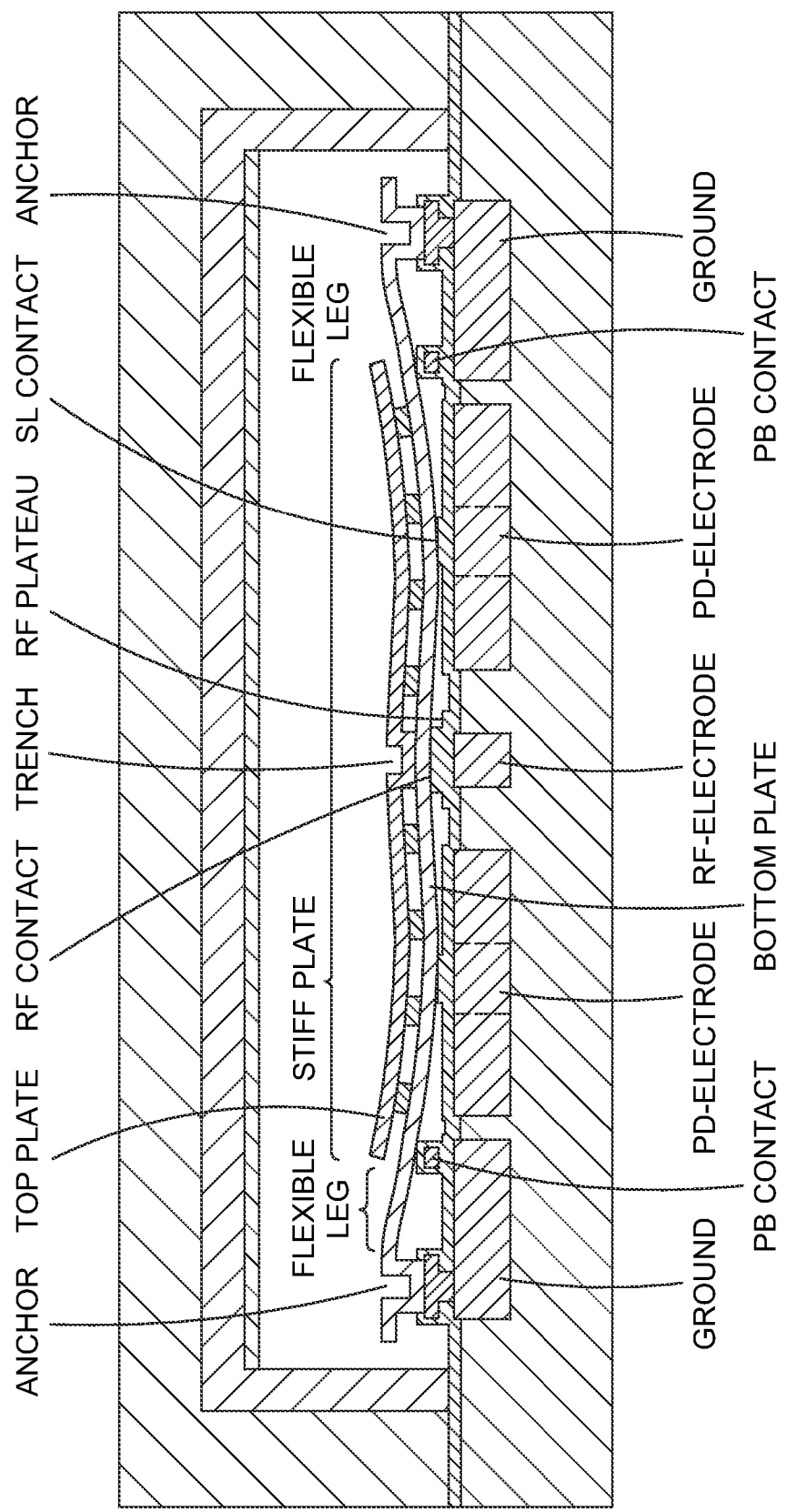
FIG. 2 is a schematic cross-sectional illustration of the MEMS DVC of FIG. 1 in the $C_{max}$ state.
Figure 3:
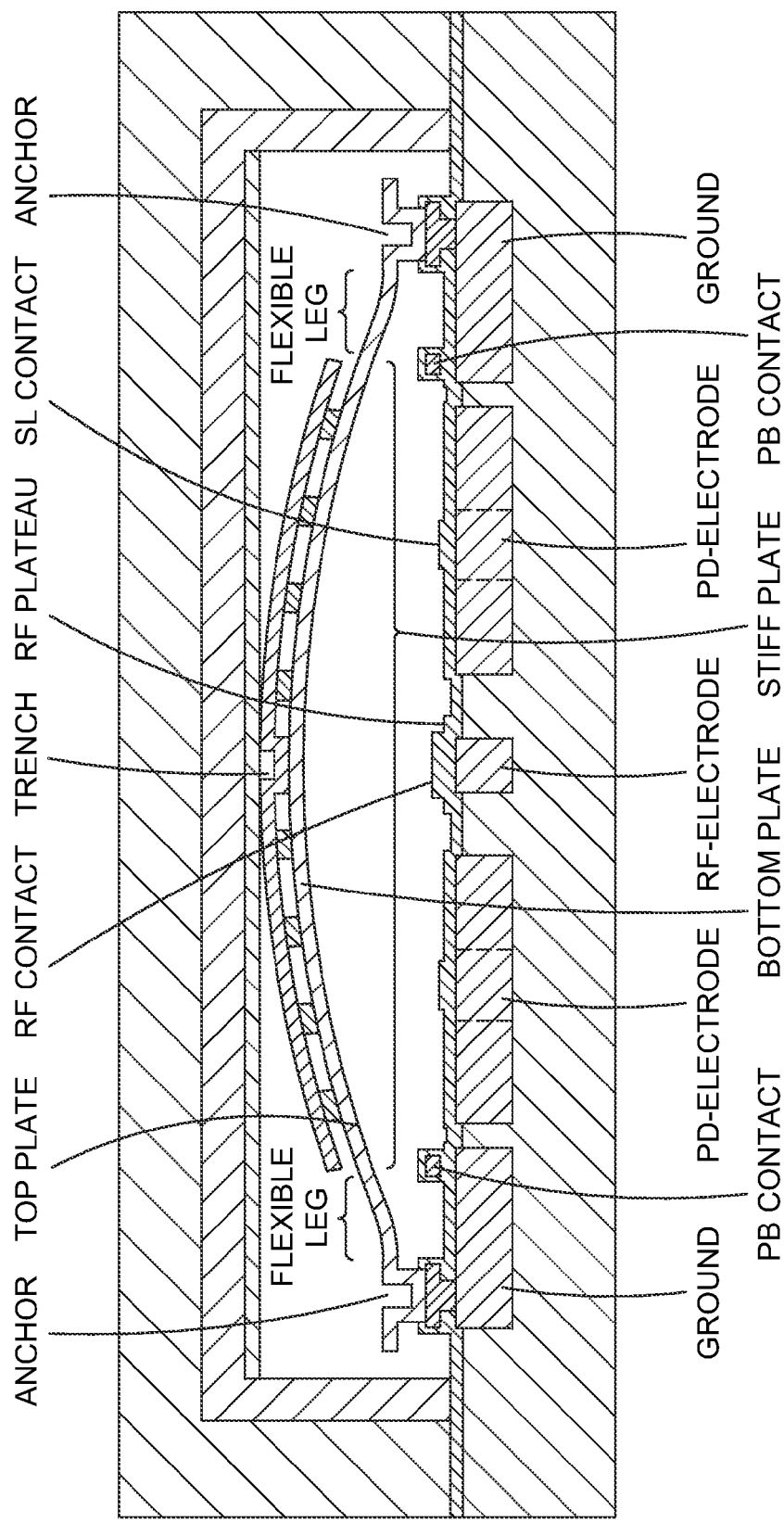
FIG. 3 is a schematic cross-sectional illustration of the MEMS DVC of FIG. 1 in the $C_{min}$ state.

The present invention generally relates to a MEMS device and a method of manufacture thereof. The RF electrode, and hence, the dielectric layer thereover, has a curved upper surface that substantially matches the contact area of the bottom surface of the movable plate. As such, the movable plate is able to have good contact with the dielectric layer and thus, good capacitance is achieved.

The aim of the embodiments discussed herein is to ensure that the RF electrode is domed to match the doming of the bottom surface of the plate electrode so that when they touch, they are in intimate contact. When the sacrificial material is spun over the RF electrode, the sacrificial material does not perfectly planarize, rather, the sacrificial material forms a slight convex bump over the RF electrode. The subsequent MEMS device follows this shape. Thus, to ensure intimate contact, the embodiments herein discuss how CMP can be used to round the RF electrode to match the MEMS curvature. The RF electrode is intentionally made to be slightly domed (convex). The sacrificial material, when deposited on top of the RF electrode, is not perfectly planar, and is thus also slightly convex. The convex shape enhances the natural convex trend of the (not perfectly planar) sacrificial material because the RF electrode naturally sits slightly above the neighboring dielectric.

The metal beam is deposited on top of the slightly domed sacrificial material and is conformal—matching the shape of the sacrificial material. As a result, the beam takes on the same general domed shape of the underlying RF electrode. Once the sacrificial material is removed and the device is in operation, the beam makes a more intimate contact with the underlying RF electrode. This results in better $C_{max}$ performance, and in fact, $C_{max}$ is higher. In addition, the nature of the intimacy (domed to domed) allows for more consistent intimacy between the surfaces, and an overall improvement in device performance uniformity from device to device.

During operation of the DVC device, $C_{max}$ (as defined when the beam touches the dielectric layer on the bottom RF electrode) is a function of the nature of the physical intimacy between the beam and the electrode. In an ideal situation, the beam would be exactly the same shape as the electrode and make a perfect contact. In reality, the beam and RF electrode are different shapes, as defined by their respective process steps. The shape of the beam is a function of sacrificial material doming over the RF electrode.

In general, the embodiments herein are damascene like processes wherein dielectric and metal are polished at the same time. The result of the CMP process is that the RF and dielectric are near level with each other. In addition, the RF electrode metal is convex (domed) in shape.

To obtain desired doming of the RF metal, the CMP process is optimized for the following characteristics: Oxide polish rate is slightly greater than metal polish rate. This is achieved by controlling the following process conditions: CMP pressure and pre-conditioning of the CMP pads by dummy wafers; thickness of the individual layers of the RF electrode metal stack; and thermal budget of the RF electrode metal stack. RF electrode metal stack and thermal budgets will have an effect on having a uniform electrode surface. The RF electrode metal stack and thermal budgets will not affect the oxide polish rate.

A subsequent dimple process further recesses the dielectric relative to the RF electrode metal, increasing the overall doming of the area (dielectric+RF+dielectric). The dimple process is controlled in a feed-forward system so that the recess of the dielectric is at standard value. Sacrificial material is spun on top of the already domed and raised RF electrode. This spin on dielectric is not perfectly planar, and dampens the shape of the underlying RF electrode and dielectric. The actual capacitor beam is deposited conformally on top of the sacrificial material. The sacrificial material is released, and the beam is allowed to move up and down during normal operation. The shape of the beam closely resembles the shape of the underlying material that it contacts, resulting in a more uniform and predictable contact (this defines an improved $C_{max}$ value and improved $C_{max}$ uniformity) as well as improved linearity as close intimacy between the two surfaces minimizes any changes in capacitance value with the onset of RF power.

Figure 4A:
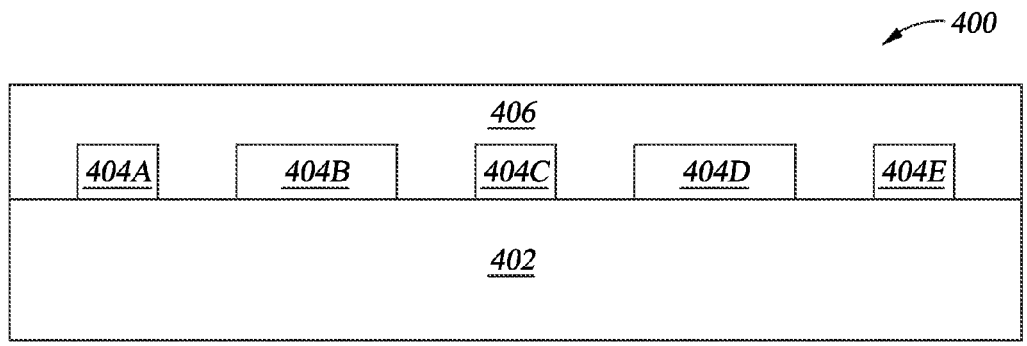

FIGS. 4A-4F are schematic cross-sectional illustrations of a MEMS DVC 400 at various stages of manufacturing. As shown in FIG. 4A, the MEMS DVC comprises a substrate 402. The substrate 402 may comprise a single layer substrate or may comprise a multilayer substrate such as would be present in complementary metal oxide semiconductor (CMOS) back end of the line (BEOL) processing. Within the substrate 402, although not shown, may be conductive interconnects to connect to the electrodes of the MEMS DVC.

Over the substrate 402, an electrically conductive material is deposited and patterned to form ground electrodes 404A, 404E, pull-in electrodes 404B, 404D (oftentimes referred to as pull-down electrodes or PD electrodes), and an RF electrode 404C. The electrically conductive material may comprise a single layer material or may comprise a multi layer structure. The electrically conductive material may comprise tungsten, titanium, titanium nitride, titanium aluminum, titanium aluminum nitride, copper, alloys thereof, and combinations thereof. The electrically conductive material may be deposited by well known deposition methods including physical vapor deposition (PVD), chemical vapor deposition (CVD), and atomic layer deposition (ALD).

Over the exposed substrate 402 and electrodes 404A-404E, a dielectric layer 406 is deposited. The dielectric layer 406 may be deposited by well known deposition methods such as CVD and ALD. Suitable dielectric materials that may be used include silicon oxide, silicon oxynitride, silicon nitride, silicon dioxide, and combinations thereof. As shown in FIG. 4A, both the electrodes 404A-404E and the dielectric layer 406 have substantially planar top surfaces. It is to be understood that the electrodes 404A-404E and the dielectric layer 406 may have non-planar top surfaces in certain embodiments.

Figure 4B:
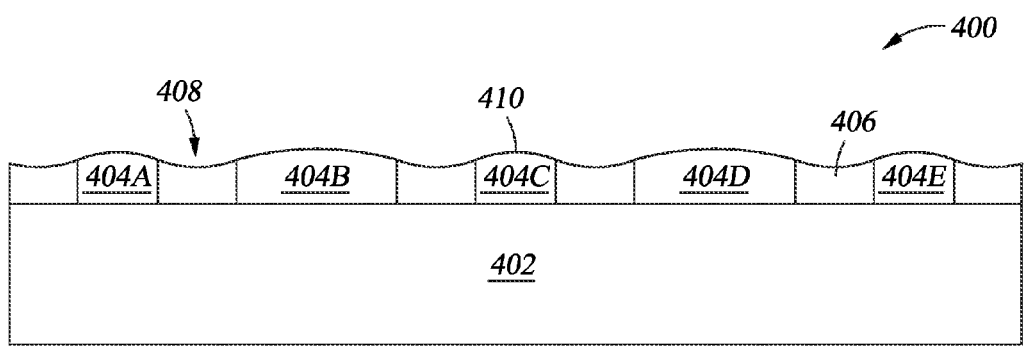

The dielectric layer 406 is then polished to expose the electrodes 404A-404E. The dielectric layer 406 is polished by a chemical mechanical polishing (CMP) process. During the CMP, the dielectric layer 406 is polished back to be substantially even with the electrodes 404A-404E. Over polishing occurs so that dishing of the dielectric layer 406 whereby the upper surface 408 of the dielectric layer 406 may be concave. While dishing occurs for the dielectric layer 406, the electrodes 404A-404E are polishing to have a convex surface 410 as shown in FIG. 4B.

Figure 4C:
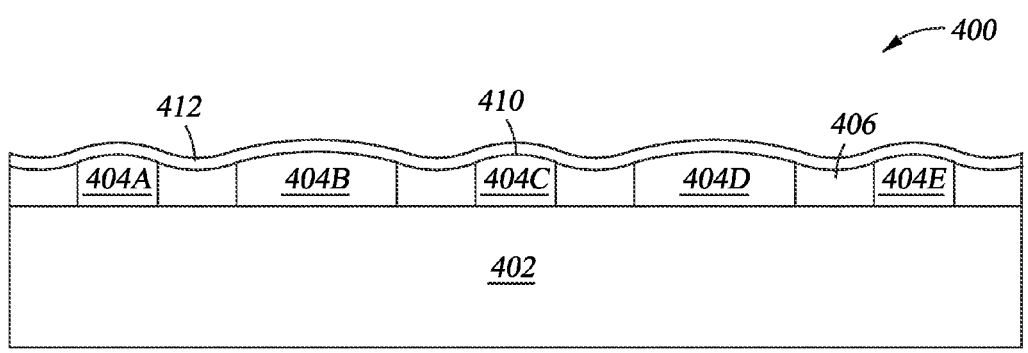

Once the CMP process has concluded, a dielectric layer 412 is conformally deposited over the dielectric layer 406 and electrodes 404A-404E. The dielectric layer 412 may comprise silicon oxide, silicon oxynitride, silicon nitride, silicon dioxide and combinations thereof and be deposited by a deposition method such as CVD, PVD or ALD. In one embodiment, the deposition method may comprise PECVD. The dielectric layer 412 has a substantially uniform thickness and, because conformally deposited, retains the convex shape over the RF electrode 404C as shown in FIG. 4C.

Thereafter, a sacrificial layer 414 is deposited over the dielectric layer 412. The sacrificial layer 414 may comprise an organic material and be deposited by a spin-on process. The sacrificial layer 414 is then reflowed to make a substantially flat top surface. However, the sacrificial layer 414, even though reflowed, will end up with a substantially convex surface above the convex electrodes 404A-404E. The bottom plate 416 is then deposited over the sacrificial layer 414 as shown in FIG. 4D and, due to the convex portion of the sacrificial layer 414, has a concave portion best shown in magnified FIG. 4E. Thus, the bottom surface of the bottom plate 416 has a concave portion that substantially matches the convex surface 410 of the RF electrode 404C. Suitable materials for the bottom plate 416 include tungsten, titanium, titanium nitride, titanium aluminum, titanium aluminum nitride, copper, alloys thereof, and combinations thereof. The bottom plate 416 may be deposited by well known deposition methods including PVD, CVD, and ALD.

Once the sacrificial layer 414 has been removed, the plate is movable within the cavity of the MEMS DVC and hence, the bottom surface of the bottom plate 416 can be pulled into contact with the dielectric layer 412 as shown in FIG. 4F. Because the bottom plate 416 has a concave portion that overlies the RF electrode 404C, the bottom plate 416 is pulled into intimate contact with the dielectric layer 412 and hence, $C_{max}$ is achieved more uniformly than compared to when a flat bottom surface for the bottom plate 416 is used.

The embodiments discussed herein provide a convex RF electrode, and hence, a curved dielectric thereover. Due to the slightly convex sacrificial layer, the bottom surface of the bottom beam has a concave surface to substantially match the convex shape of the dielectric layer over the RF electrode. As such, the bottom surface of the beam has better contact with the dielectric layer over the RF electrode and hence, a higher $C_{max}$. As a result, there is improved $C_{max}$ uniformity and less within substrate and substrate-to-substrate variation. During fabrication as compared to non-curved RF electrode based devices.

While the foregoing is directed to embodiments of the present invention, other and further embodiments of the invention may be devised without departing from the basic scope thereof, and the scope thereof is determined by the claims that follow.

The invention claimed is:

1. A method of manufacturing a MEMS DVC, comprising:
    forming one or more electrodes over a substrate;
    depositing a dielectric layer over the electrodes and the substrate;
    chemical mechanically polishing the dielectric layer to expose the one or more electrodes, wherein the chemical mechanical polishing results in a convex upper surface of the one or more electrodes; and
    forming a plate electrode over the one or more electrodes, wherein the plate electrode has a bottom surface having a concave portion overlying the convex upper surface of the one or more electrodes.

2. The method of claim 1, further comprising:
    depositing a second dielectric layer over the chemical mechanically polished dielectric layer and the one or more electrodes.

3. The method of claim 2, wherein the second dielectric layer is conformally deposited.

4. The method of claim 3, wherein the second dielectric layer has a convex surface overlying the convex upper surface of the one or more electrodes.

5. The method of claim 4, further comprising:
    depositing a sacrificial layer over the second dielectric layer, wherein the sacrificial layer has a convex surface overlying the convex upper surface of the one or more electrodes.

6. The method of claim 5, wherein forming the plate electrode comprises forming the plate electrode over the sacrificial layer.

7. The method of claim 6, wherein the concave portion is in contact with the convex surface of the sacrificial layer.

8. The method of claim 7, further comprising removing the sacrificial layer.

9. The method of claim 1, wherein the one or more electrodes includes an RF electrode.

10. The method of claim 9, wherein the RF electrode has the convex upper surface.

11. The method of claim 10, wherein the dielectric layer is deposited by PECVD.

12. The method of claim 11, wherein the dielectric layer is selected from the group consisting of silicon oxide, silicon oxynitride, silicon nitride, silicon dioxide and combinations thereof.

* * * * *